United States Patent
Link et al.

(10) Patent No.: US 10,530,115 B2
(45) Date of Patent: Jan. 7, 2020

(54) PULSED LASER

(71) Applicant: ETH ZÜRICH, Zürich (CH)

(72) Inventors: Sandro Michael Link, Zürich (CH); Bonifatius Wilhelmus Tilma, Neuenhof (CH); Mario Mangold, Zürich (CH); Christian Anton Zaugg, Zürich (CH); Alexander Klenner, Zürich (CH); Ursula Keller, Uitikon (CH)

(73) Assignee: ETH ZÜRICH, Zürich (CH)

( * ) Notice: Subject to any disclaimer, the term of this patent is extended or adjusted under 35 U.S.C. 154(b) by 0 days.

(21) Appl. No.: 15/515,782

(22) PCT Filed: Sep. 30, 2015

(86) PCT No.: PCT/CH2015/000145
§ 371 (c)(1),
(2) Date: Mar. 30, 2017

(87) PCT Pub. No.: WO2016/049787
PCT Pub. Date: Apr. 7, 2016

(65) Prior Publication Data
US 2017/0310072 A1   Oct. 26, 2017

(30) Foreign Application Priority Data
Oct. 2, 2014 (CH) .................................. 1498/14

(51) Int. Cl.
*H01S 3/08* (2006.01)
*H01S 3/11* (2006.01)
(Continued)

(52) U.S. Cl.
CPC .......... *H01S 3/1118* (2013.01); *H01S 3/0602* (2013.01); *H01S 3/08004* (2013.01);
(Continued)

(58) Field of Classification Search
CPC ..................... H01S 3/08054; H01S 3/10061
See application file for complete search history.

(56) References Cited

U.S. PATENT DOCUMENTS 5,091,912 A * 2/1992 Bretenaker ........... H01S 3/1396
372/105
5,182,759 A * 1/1993 Anthon ..................... H01S 3/07
372/107

(Continued)

FOREIGN PATENT DOCUMENTS

WO         01/59895        8/2001
WO       2005/098573      10/2005
(Continued)

OTHER PUBLICATIONS

International Preliminary Report on Patentability dated Apr. 4, 2017 (Apr. 4, 2017), Application No. PCT/CH2015/000145, 7 pages.

*Primary Examiner* — Tod T Van Roy
(74) *Attorney, Agent, or Firm* — Rankin, Hill & Clark LLP

(57) ABSTRACT

An apparatus for emitting pulsed electromagnetic laser radiation includes a laser gain element; an optical arrangement defining a laser resonator and arranged to re-direct radiation emitted by the gain element along a beam path back onto the gain element, the optical arrangement comprising an output coupler configured to couple a portion of the radiation in the laser resonator out of the laser resonator; and, a pump arrangement configured to pump the laser gain element. The optical arrangement includes a mode locker placed in the laser resonator in the beam path, and a birefringent element placed in the laser resonator in the beam path.

24 Claims, 3 Drawing Sheets

(51) Int. Cl.
*H01S 5/04* (2006.01)
*H01S 3/06* (2006.01)
*H01S 3/10* (2006.01)
*H01S 5/042* (2006.01)
*H01S 5/065* (2006.01)
*H01S 5/10* (2006.01)
*H01S 5/14* (2006.01)
*H01S 5/183* (2006.01)
*H01S 3/081* (2006.01)

(52) U.S. Cl.
CPC ........ *H01S 3/0809* (2013.01); *H01S 3/08054* (2013.01); *H01S 3/10061* (2013.01); *H01S 5/041* (2013.01); *H01S 5/042* (2013.01); *H01S 5/0657* (2013.01); *H01S 5/1096* (2013.01); *H01S 5/14* (2013.01); *H01S 5/18302* (2013.01); *H01S 3/0627* (2013.01); *H01S 3/0815* (2013.01)

(56) References Cited

U.S. PATENT DOCUMENTS

| | | | |
|---|---|---|---|
| 6,028,869 A * | 2/2000 | Harada | H01S 3/08036 359/489.09 |
| 6,850,544 B2 * | 2/2005 | Friesem | H01S 3/08036 372/105 |
| 9,726,472 B1 * | 8/2017 | Diels | G01B 9/02049 |
| 2005/0232313 A1 | 10/2005 | Fermann et al. | |
| 2015/0288141 A1 * | 10/2015 | Fallahi | H01S 3/07 372/20 |

FOREIGN PATENT DOCUMENTS

| | | | | |
|---|---|---|---|---|
| WO | 2010/056920 | | 5/2010 | |
| WO | WO-2012101367 A1 * | | 8/2012 | ............ H01S 3/106 |
| WO | 2014/039942 | | 3/2014 | |
| WO | WO2015/169916 | * | 11/2015 | |

* cited by examiner

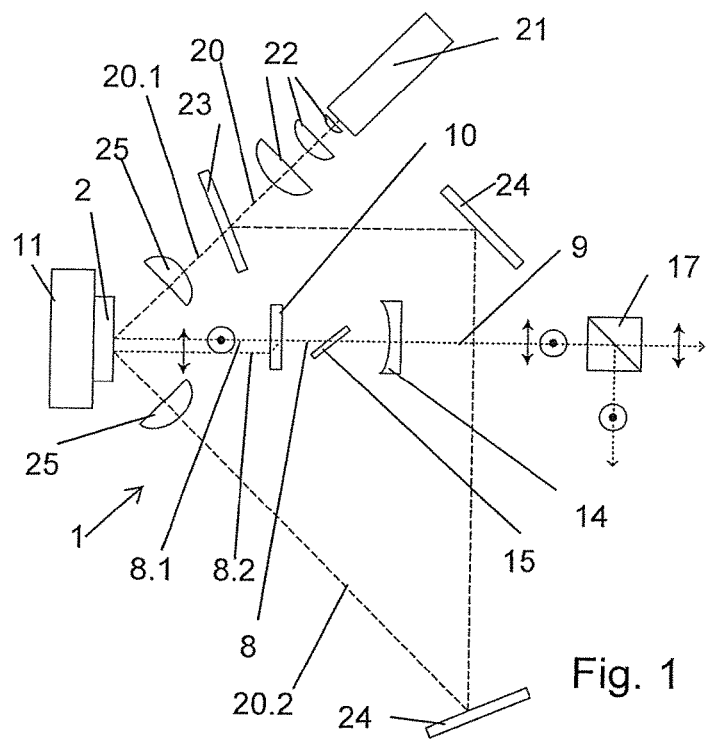
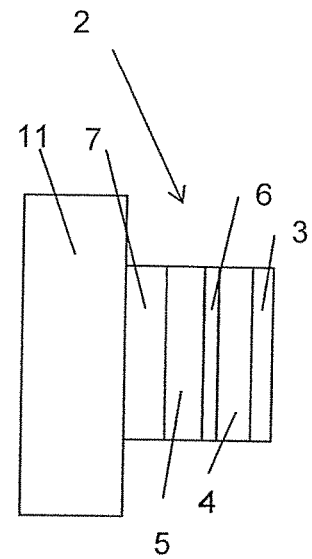
Fig. 2
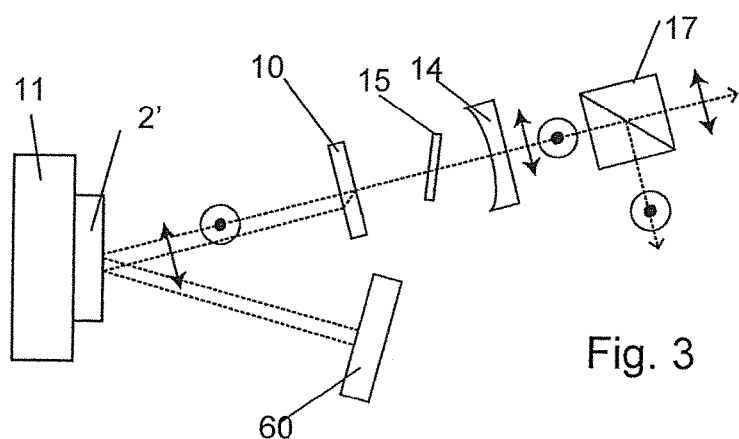
Fig. 3
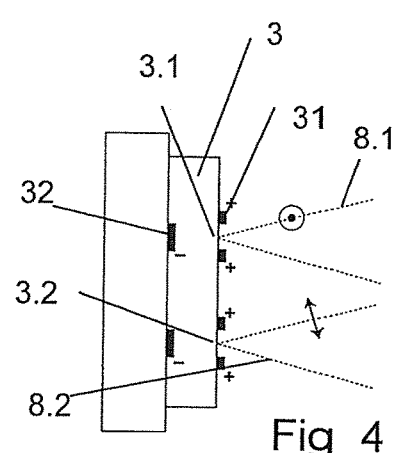
Fig 4

PULSED LASER

BACKGROUD OF THE INVENTION

Field of the Invention

The invention is in the field of radiation sources of pulsed electromagnetic radiation.

Description of Related Art

Several advanced optical measurement technologies need radiation sources that generate so-called frequency combs, i.e. an output that includes a plurality of portions of different, especially equally spaced frequencies. Possible sources of such radiation are pulsed lasers. For example, dual comb spectroscopy based on optical multi-heterodyne detection schemes requires two frequency combs with slightly offset frequencies. To this end, two almost identical pulsed lasers are used. The two pulsed lasers each generate a frequency comb in the (optical) frequency domain and should have a slight difference in pulse repetition rate (a few Hz to several MHz), so that the beat signal of the two combs is one comb with longer wavelengths (for example, in the microwave region).

The problem is that providing and operating two almost identical pulsed lasers is in general very expensive and involves lots of optical components and therefore is not easily applicable for industry.

SUMMARY OF THE INVENTION

It is an object of the present invention to provide a radiation source of pulsed electromagnetic radiation generating two almost identical trains of radiation pulses of slightly different or even equal pulse repetition frequencies, which radiation source overcomes drawbacks of prior art radiation sources. Especially, it should be possible to manufacture and operate the radiation source at less cost compared to the above-discussed radiation sources.

These and other objects are achieved by a radiation source being an apparatus for emitting pulsed electromagnetic laser radiation, including:
  a laser gain element;
  an optical arrangement defining a laser resonator and arranged to re-direct radiation emitted by the gain element along a beam path back onto the gain element, the optical arrangement comprising an output coupler configured to couple a portion of the radiation in the laser resonator out of the laser resonator;
  a pump arrangement configured to pump the laser gain element;
  wherein the optical arrangement includes a mode locker placed in the laser resonator in the beam path; and
  wherein the optical arrangement further includes a birefringent element placed in the laser resonator in the beam path.

The mode locker causes the radiation in the laser resonator (intracavity radiation) to be pulsed radiation. This ensures that output radiation has a certain spectral width making a plurality of peaks in the optical spectrum and consequently a frequency comb possible.

The birefringent element causes portions of the intracavity radiation of different polarization states to be spatially separated. As a consequence, the optical path length of radiation may, and generally will, depend on the polarization. Because the pulse repetition rate directly depends on the optical path length (the pulse repetition frequency being inversely proportional to the intracavity optical path length), this will cause two pulse trains of different polarization states and with potentially different intracavity optical path lengths to coexist. As a consequence, the radiation source will emit two trains of pluses with possibly slightly different pulse repetition rates. Also, due to the slightly different intracavity optical lengths, the frequencies of the peaks in the optical spectrum will slightly differ between the portions.

Therefore, in the apparatus, two mode locked laser beams share the same laser resonator components. The radiation portions use a common gain element, although possibly with spots at different locations on the gain element, and they may have a common output coupler. Also the pump arrangement can be shared. This has a big advantage compared to two separated laser systems. The complexity and size of the setup is drastically reduced. Also the needed optical elements are minimized. This leads to a strong reduction of the costs, needed to generate two mode locked laser beams.

Furthermore, due to the fact that the laser emits short (fs or ps) laser pulses, the optical spectrum can be broadened externally, e.g. in a fiber by means of self-phase modulation (SPM) or in a highly nonlinear photonic crystal fiber. This potentially can lead to coherent frequency combs with bandwidth greater than 1000 nm. Such wavelength coverage seems to be impossible with tunable lasers, with currently not more than 150 nm bandwidth being achievable.

The mode locker may be a passive mode locker. Especially, the mode locker may comprise a saturable absorber, such as a semiconductor material saturably absorbing intracavity radiation. Also other saturable absorber materials (such as graphene etc.) or other passive mode locker means such as a Kerr lens mode locker (KLM) are not excluded.

If the mode locker includes a saturable absorber, which may be present in one or more saturably absorbing layer(s) in a semiconductor layer structure, the saturable absorber may belong to a mirror structure, so that the saturable absorber is part of a mirror element such as a semiconductor-based saturable absorber mirror sold under the trademark SESAM®. As explained in more detail further below, the saturable absorber may also be integrated in a monolithic gain structure that further comprises the gain element.

In this text, the term "layer", unless otherwise specified, is meant to not be restricting to contiguous or even homogeneous layers but, for example, includes the possibility of a layer of quantum dots, which quantum dots are not (not necessarily) connected to each other. Especially, a semiconductor saturable absorber layer may be constituted by a deposit of quantum dots.

If the mode locker includes a saturable absorber, the optical arrangement may especially be such that the portions belonging to different polarizations (and hence to the different pulse trains) are incident on the saturable absorber in different places. Thereby, cross-coupling effects are avoided.

The difference between the optical path lengths of the different radiation portions depends on the geometrical configuration. Because the spatial separation brought about by a birefringent element though being substantial will generally be comparably small, that both radiation portions can be guided in the resonator to travel almost the same path in the resonator.

Moreover, the optical beam path length can be influenced and tailored because the portions are spatially separated within the resonator, and hence radiation direction elements and/or retarding elements having an index of refraction different from a medium in the cavity (usually air) can be individually placed, for example in the beam path of one portion to individually control the beam path lengths of the portions, for example by enlarging or reducing the optical path length for one portion in relation to the other portion.

Especially, the beam path length can be tailored to be almost equal, so that the pulse repetition rates of the two pulse trains differ by an only small amount choosable depending on the needs.

In embodiments it is even possible to use electro- or acousto-optic effects for stabilization or repetition rate tuning of one or both of the beams. By electro- or acousto-optic effects, a slight change the refractive index of one of the media in the resonator can be brought about.

The birefringent element may be a birefringent anisotropic crystal. However, also other sources of birefringence are not excluded for the birefringent element, for example Kerr effect or Faraday effect or stress induced birefringence.

In accordance with an option, it is possible that the birefringent element is also an electro-optic modulator for repetition rate frequency tuning and stabilization. In accordance with a further option, an electro-optic modulator may be placed as a separate element within the resonator.

The optical arrangement may include two end reflectors so that the resonator supports standing waves. In this, one of the end reflectors may serve as the output coupler by being a partially transparent reflector. However, also optical arrangements defining a ring laser resonator are not excluded.

The optical arrangement comprises at least one output coupler that couples a portion of the intracavity radiation out of the resonator. Such output coupler may be an outcoupling mirror as known for lasers. Especially, the two intracavity radiation beam portions may have one common output coupler. For example, the optical arrangement may be such that the two radiation portions coincide between the birefringent element and the output coupler.

Instead of being a mirror, the output coupler may also be constituted by an other suitable element such as an intracavity absorbing element, for example a gas, a liquid or a solid.

The laser gain element may in principle include any gain material that is capable of emitting laser radiation of sufficient spectral width to support generation of laser pulses. Especially, the laser gain element may have a semiconductor gain structure or a gain laser crystal.

The pump arrangement may include an optical pump, such as a pumping radiation source that includes a laser diode or other pumping radiation source. If the gain element is a semiconductor gain element, the pump arrangement may alternatively include an electrical pump that injects charge carriers into a gain region of the gain element.

If the gain element is a semiconductor gain element, it may be vertically emitting, i.e. emitting in an out-of-plane direction in relation the planes defined by the semiconductor heterostructure that forms the gain element, for example including a quantum well layer. The term "vertically emitting" in this text does not imply that the emitted beam is perpendicular to the layer plane, but only implies that it is not in-plane.

Also, in embodiments, it may be advantageous if the optical arrangement is such that the portions of the different polarization states are separated on the gain element. This may be an advantage especially for gain elements in which the gain immediately after incidence of a pulse is substantially lower than immediately before, i.e. if the gain element is such that in each cycle a substantial portion of upper-state population is emptied by a pulse. In practice, this is often the case if the gain element is a semiconductor gain element, whereas in many solid-state gain elements the number of states is sufficiently high for this effect to play only a minor role.

While the separation of the beam spots of the different polarization state portions on the gain element may be advantageous in such systems where the substantially gain depends on the previous history and thus cross-coupling effects could arise for the two trains of pulses, it is not ruled out that other means than the separation of the beam spots may be envisaged for dealing with this effect.

A vertically emitting semiconductor gain element on which the first and second portions are incident at different places (two spots) may be optically pumped by two separate pump beams, one pump beam for each spot. Such separate pump beams may be generated by two separate pump sources (such as laser diode bars), or by a single pump source with a beam splitter. Alternatively, a single pump beam may be used for the two spots, wherein the pump beam is focused in a manner that it is incident on a sufficiently large area on the vertically emitting gain element.

A particularly simple set-up results if a saturable absorber serving as the mode locker is integrated in a monolithic gain structure, especially a vertically emitting semiconductor structure (as known from VECSELs), that also includes the gain element. In such a set-up, the apparatus, which emits two trains of laser pulses, may be as simple as having only three essential components, namely the gain structure with the integrated absorber, which monolithic gain structure also has a mirror and serves as one of the end reflectors, the outcoupling mirror and the birefringent element, with a possible radiation stabilizer and/or a retarding element as additional optional component(s). Monolithic gain structures for optically pumped VECSELs with an integrated saturable absorber are for example described in WO2001/059895 and in WO2005/098573.

In addition to the set-up being particularly simple, a further advantage of this apparatus is the relative well-known fabrication technology of the semiconductor layer stack that forms the monolithic gain structure. Comparable or even more difficult layer stacks—that may for example include two Bragg mirrors—are grown for VCSELs in various facilities. The monolithic gain structure used for this group of embodiments is therefore rather straightforward to manufacture in commercially operating fabrication facilities.

VECSELs with an integrated saturable absorber (also called MIXSELs) as a part of the semiconductor disk laser (SDL) family can be designed for different center wavelengths and pulse trains in the picosecond and femtosecond domain. Pulse repetition rates between 100 MHz and 100 GHz have been demonstrated for different SDLs. In addition to the already demonstrated operation at around 960 nm, the MIXSEL can be designed at different emission wavelengths ranging from 390 nm up to 5.3 µm using different semiconductor active materials like GaN, GaInP, GaAs, InGaAs, GaInNAs, AlGaInAs, InGaAsP, InGaAlAs, InGaSb and PbTe which can be grown on GaN, GaAs, InP, GaSb, BaF$_2$ substrates. These active materials are, of course, also an option for gain elements in embodiments that do not have the integration of the saturable absorber and the gain element in a single monolithic gain structure.

An integrated set-up in which the gain element and further elements, for example a mirror and/or a saturable absorber, are integrated in a common monolithic gain structure, is also possible with other gain elements, for example a laser gain crystal mounted on a mirror, possibly with the saturable absorber being a further layer of the monolithic gain structure.

Alternative and/or further measures of integration are possible. For example, the birefringent element can be part of a common monolithic structure that also includes the gain element and may further include an intermediate layer, for example, a bonding and/or heat spreading layer.

It is even possible to implement the invention in a monolithic cavity design, in which the end reflectors (one of them being an output coupler), the gain element, the saturable absorber and the birefringent element are all elements (especially layers) of a monolithic resonator structure. Such an integrated design has a particularly compact and simple design.

In other embodiments, in addition to the mentioned elements, the optical arrangement defining the laser resonator may also have at least one folding mirror. Folding mirrors or other radiation re-directors make larger laser resonators on a limited space possible. If such a folding mirror is present, it may optionally include at least one of the mode locker (such as the saturable absorber) and of the gain element, and/or it may be the output coupler. Such elements can also be represented by coated end facets of a solid-state re-directing the radiation portions internally, in a monolithic resonator design.

Especially, in embodiments, the laser resonator forms a V-cavity, with the gain structure that comprises the semiconductor gain element is a folding mirror, with on one side a mirror integrating the saturable absorber as end mirror and on the other side the birefringent element and the output coupler.

In accordance with a special group of embodiments, the laser resonator has more than one birefringent element. In this, multiple birefringent elements are cascaded to split the beam into more than two radiation portions two achieve more than two mode locked beams. For cascading a second birefringent medium is placed at an angle of for example 45° in at least one of the partial beams, i.e. in a beam path of at least one of the radiation portions at a place where they are spatially separated.

Returning to the gain element, in embodiments in which the gain element is a crystal being a solid-state gain element, the gain element may be a uniaxial crystal. A uniaxial crystal has the property that it can be placed in a manner that its properties, including the gain factor, do not depend on the polarization of the incoming radiation, so that both polarization states encounter a same amplification. In these embodiments, the optic axis of the uniaxial crystal may be aligned with the beam, i.e. the intracavity radiation propagates through the uniaxial crystal in a direction substantially parallel to the optic axis.

As an alternative to a uniaxial crystal, the gain crystal may also be a non uniaxial crystal, for example with a small extinction rate between the different polarizations.

An example of a usable uniaxial gain crystal is CALGO ($CaAlGdO_4$; doped for example by Yb; Yb:CALGO). An other example of a gain crystal is YAG ($Y_3Al_5O_{12}$; Yb:YAG). In embodiments, the optical arrangement further comprises an etalon placed within the resonator. Such etalon may be advantageous for wavelength stabilization and/or wavelength tuning.

In this text, in accordance with conventions, the term 'optical path length' is used to denote product of the geometric length of the path radiation follows, and the index of refraction of the medium through which it propagates.

Depending on the application, the apparatus may further include a polarizing beam splitter (for example including a birefringent element) placed outside of the laser resonator arranged in a beam path of the radiation portion coupled out of the laser resonator.

Also, the apparatus may include a halfwave plate in a beam path of one of the beam portions following the polarizing beam splitter plate to make the polarizations coincide—for applications (such as the spectroscopy applications described hereinafter) in which interference between the portions is exploited.

The apparatus according to the invention can be used for multi-heterodyne optical spectroscopy. This kind of spectroscopy features the advantage that due to signal mixing, signals (such as absorption signals) in a frequency range that is difficult to detect are transferred into a frequency range in which detection is easier, for example from the THz region into the MHz or even kHz range, depending on the frequency shift between the two signals. One example would be for gas detection. Due to the possibility of coherently broadening the spectrum afterwards, a large wavelength spectrum can be covered at the same time. This has the advantage that multiple gases can be detected at the same time, or more complex gases with a broad absorption spectrum can be measured. A special set-up using this technique has for example been described in B. Bernhardt et al., "Cavity-enhanced dual-comb spectroscopy", Nature Photonics 4, 55-57 (2010).

Another area of application is asynchronous optical sampling (ASOPS). This pump-probe technique makes use of the fact that the two pulse trains have a small difference in pulse repetition rate. This has the effect that the delay between the two pulses is linearly increased over time. Thus, the full range of time delays is automatically scanned through. A fast detection mechanism can extract the pump-probe information from the delayed pulses without using conventional moving optical delay lines. ASOPS has for example been described by P. Elzinga et al, "Pump/probe method for fast analysis of visible spectral signatures utilizing asynchronous optical sampling", Applied Optics 26, p. 4303 (1987).

For pump-probe applications such as Asynchronous Optical Sampling (ASOPS), the polarizing beam splitter is not required if the measurements are polarization independent. If the measurement is polarization dependent, the apparatus may include a polarizing beam splitter, a halfwave plate to rotate the polarization of one branch, and a re-combiner.

A third application would be fiber Bragg grating sensing. This sensing technology relies on changes in spectral response of fiber Bragg grating fibers (due to external influences such as stress banding and thermal changes). Currently tunable lasers or broadband light sources are used. These can be replaced by one of the frequency combs from the radiation source according to the invention. The reflected or transmitted spectrum can be analyzed with the other comb from the radiation source. The complete optical spectrum is in this way converted to the RF domain and can be analyzed using conventional electronics. This is basically also a multi-heterodyne spectroscopy system as described for gas sensing.

Other measurement methods relying on spectroscopic information could be imagined as well.

The invention therefore also concerns a combination of the radiation source as described herein with a dual-comb spectrometer, with an ASOPS optical sampler, or with a fiber Bragg grating sensing apparatus. The invention also concerns the use of the radiation source for dual-comb spectroscopy, ASOPS, or fiber Bragg grating sensing or other spectroscopic applications relying on multi-heterodyne spectroscopy with the two frequency combs.

BRIEF DESCRIPTION OF THE DRAWINGS

Hereinafter, embodiments of the present invention are described referring to drawings. In the drawings, same reference numbers denote same or analogous elements. The drawings show:

FIG. 1 a set-up with a radiation source;
FIG. 2 a scheme of a monolithic gain and absorber structure;
FIG. 3 a set-up with an alternative radiation source;
FIG. 4 an electrically pumped VECSEL gain element.

DESCRIPTION OF THE PREFERRED EMBODIMENTS

Figure 5:
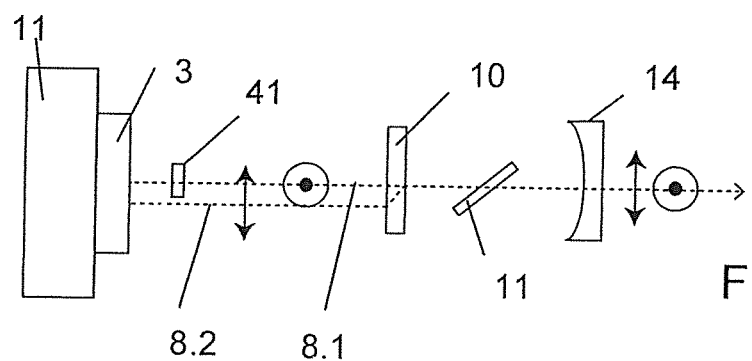
FIG. 5 a further radiation source.

The radiation source 1 shown in FIG. 1 includes a laser resonator formed between a monolithic gain structure 2 and an output coupling mirror 14.

In FIG. 1 as well as in subsequent figures, the dashed lines with the small dashes show the laser beam of the output wavelength range, and the dashed lines with long dashes show the pump beam of a shorter wavelength.

The monolithic gain structure 2 includes a reflector for the laser radiation 8 circulating in the resonator as well as a gain element and a saturable absorber serving as the passive mode locker. The monolithic structure 2 is mounted on a cooling structure, such as a (passive) heat spreader 11; active cooling is possible, too.

The output coupling mirror 14 may be of a kind known for laser outcoupling mirrors. It reflects a portion of the incident radiation back into the resonator, whereas an other portion is coupled out and serves as output radiation 9. In many applications, the mirror transparency is between 0.1% and 20%. The outcoupling mirror is curved so that there is only one stable intracavity beam path for each of the portions, and that off-axis radiation is directed out of the resonator. Instead of a curved outcoupling mirror, also a flat outcoupling mirror could be used, for example in combination with some intracavity lensing element, such as a thermal lens in the semiconductor structure.

The radiation source further includes a birefringent element 10 placed in the intracavity beam path. The birefringent element 10 splits the beam 8 between two spatially separated beam portions 8.1, 8.2 of perpendicular polarizations. The beam portions 8.1, 8.2 are incident on the monolithic structure at spatially separated spots. In the depicted embodiment, the spots have no or only minimal overlap.

The radiation source in the depicted configuration also includes an optional etalon 15 for wavelength stabilization.

The gain element in the monolithic gain structure 2 is optically pumped. In the depicted embodiment, a single laser diode array 21 is used for pumping both spots on the monolithic gain structure. To this end, in addition to collimating optics 22 and focusing optics 25, the optical pump also has a beam splitter 23 and re-directing elements 24 so that the emitted pump beam 20 is split into two pump beam portions 20.1, 20.2 that are focused onto the two spots.

According to a first alternative to the illustrated configuration, two different pump sources could be used for pumping the first and second spot, respectively.

According to a second alternative, a pump source that produces a large and intensive enough beam for simultaneously pumping the two spots can be used. For example, the pump beam can be directed onto the structure surface as to produce an elliptical beam spot on the monolithic gain structure.

Also, in each of the variants, a backside pumping through the monolithic gain structure 2 can be used. In this case, the cooling means have a through opening for the pumping radiation and/or are transparent for the pumping radiation.

The output beam 9 in the depicted set-up is incident on a polarizing beam splitter 17 that separates the differently polarized portions.

Because of the different intracavity path lengths of the portions 8.1, 8.2, the differently polarized pulse trains separated by the polarizing beam splitter have a different repetition rate and a slightly different spectral composition.

FIG. 2 very schematically depicts the elements present in the monolithic gain structure 2 of the set-up according to FIG. 1. The monolithic gain structure includes, for example on an optional substrate 7 (such as a GaAs substrate), a sequence of planar elements, namely (starting from the surface) a gain element 3 of suitable semiconductor material, a pump beam reflector 4 that is reflecting for the wavelength of the pump beam but is essentially transparent for the laser radiation, a saturable absorber 6 that absorbs laser radiation but the transparency of which increases as it reaches saturation, and a laser radiation reflector 5 that reflects the intracavity radiation back through the saturable absorber 6, the pump beam reflector 4 and the gain element 3 into the resonator and thus serves as one of the end reflectors of the resonator.

In addition to the sketched elements, the structure 2 may include further optional elements, such as layers on top of the gain element. Such optional layers may for example include an antireflection coating and/or group delay dispersion compensation layers.

While FIG. 2 illustrates the reflectors, the saturable absorber and the gain element as separate elements, it is possible to at least partially integrate these elements into each other, for example to integrate the saturable absorber in a reflector structure, such as a Bragg mirror structure.

Details and different embodiments of a monolithic gain structure as the one depicted in FIG. 2, both for front side pumping and for backside pumping, are described in more detail in WO2001/059895 (especially the embodiments of FIG. 8-10 and their description) and in WO2005/098573.

The embodiment of FIG. 3 differs from the embodiment of FIG. 1 in that the gain structure 2' that includes the gain element 3 does not have the saturable absorber and does not serve as end reflector but as folding mirror of the laser resonator.

The saturable absorber is integrated in a mirror. This saturable absorber reflector element 60 may be a saturable semiconductor absorber mirror sold under the trademark SESAM®. The saturable absorber reflector element 60 serves as one end reflector of the laser resonator, the other end reflector being again defined by the output coupler 14.

While the embodiment of FIG. 3 requires more elements than the one of FIG. 1, it has the advantage of being more compact for larger cavity lengths, i.e. for smaller pulse repetition rates.

In accordance with further variants, additional folding mirrors can be added, the outcoupling mirror and/or the saturable absorber reflector element can be a folding mirror (with the structure including the gain element being an end reflector and/or with a separate end reflector), etc. The claimed invention is suited for almost any laser resonator design, as long as the birefringent element can be placed in the resonator and the two differently polarized beam portions are stable.

The radiation source of FIG. 3 can be optically pumped in the same way as the one of FIG. 1. Alternatively, it can also be electrically pumped.

FIG. 4 schematically depicts a possibility for electrical pumping of two spots 3.1, 3.2 of the gain element 3. At each spot, the gain element is contacted by an electrode pair comprising a front side ring electrode 31 and a backside electrode 32. By applying an electrical voltage between the electrodes of each pair, charge carriers are injected to yield the population inversion necessary for amplification.

In accordance with a variant, it would be possible to integrate the absorber also in an electrically pumped structure, i.e. to provide an electrically pumped MIXSEL.

FIG. 5 shows a radiation source similar to the one of FIG. 1 (the optical or electrical pump is not depicted in FIG. 5), with additionally a retarding element 41 placed in the beam path of one of the two portions 8.1, 8.2. The retarding element 41 is transparent for the laser radiation and has an index of refraction that is larger than the index of refraction of the surrounding medium (which is assumed to be air in the depicted embodiment; in other embodiments it would also be possible to have an element of smaller index of refraction than the index of refraction of the surrounding medium, acting to reduce the optical beam path length). By choosing the material and thickness of the retarding element 41, the optical beam path length of the corresponding beam portion 8.1 can be fine-tuned to have a certain desired difference to the optical beam path length of the other portion 8.2.

Of course, the possibility of adding a retarding element 41 or other means for individually influencing the optical beam path length of one of the portions exists for all embodiments of the invention described herein and is, of course, not restricted to the particular set-up shown in FIGS. 1 and 5.

Instead of placing a retarding element 41 only in the beam path of one of the portions, it would also be possible to provide a retarding element in the beam paths of both portions, with different retarding effects, i.e. enhancing the optical beam path length on one path more than on the other path. One might also envisage a retarding element with a stepped structure, with a non-constant step size so that depending on the chosen position (and hence the size of the step affecting the radiation) the difference may be tuned.

Figure 6:
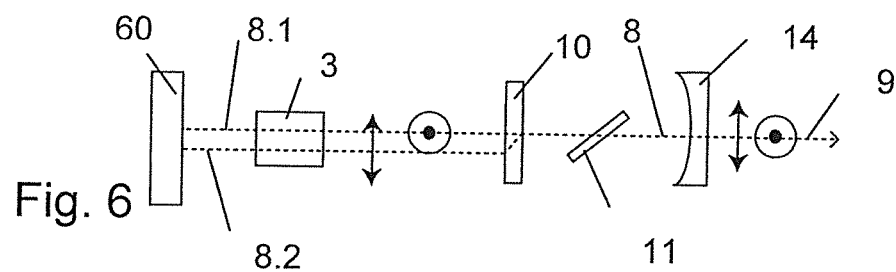
FIG. 6 a radiation source with a solid-state gain element.
Figure 7:
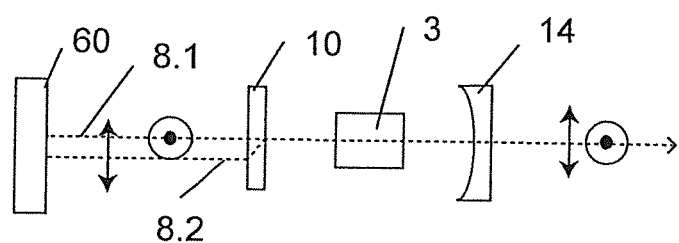
FIG. 7 an other radiation source with a solid-state gain element.

The embodiments of FIGS. 6 and 7 each show a radiation source with a solid-state gain element 3, namely a uniaxial crystal. The special axis of the uniaxial crystal is aligned with the intracavity beam. The gain element is optically pumped, for example from the side. The pump sources are not shown in FIGS. 6 and 7.

In each case, the laser resonator is defined by two end reflectors, one end reflector being a saturable absorber reflector element 60, and the other end reflector being the output coupler 14.

In the embodiment of FIG. 6, the gain element 3 is placed between the birefringent element 10 and the saturable absorber reflector element 60 where the two beam portions 8.1, 8.2 are spatially separated. Thus, like in the previously described embodiments, the portions can be directed to have only minimal or no overlap on the gain medium.

The embodiment of FIG. 7 is different from the one of FIG. 6 in that the gain element 3 is placed at a location where the beam portions coincide, here between the birefringent element 10 and the output coupler. Especially for solid-state gain media this is not problematic, because of the high number of excited states in these media and consequently the fact that little or no cross-coupling effects arise.

Figure 8:
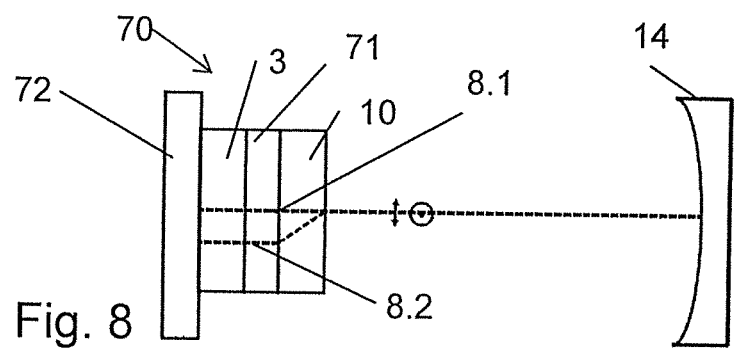
FIGS. 8 and 9 radiation sources with the gain element and the birefringent element being integrated in a common monolithic structure.
Figure 9:
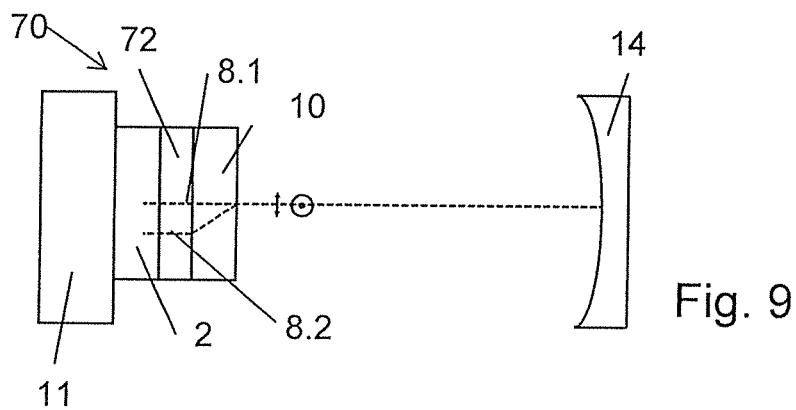
Figure 10:
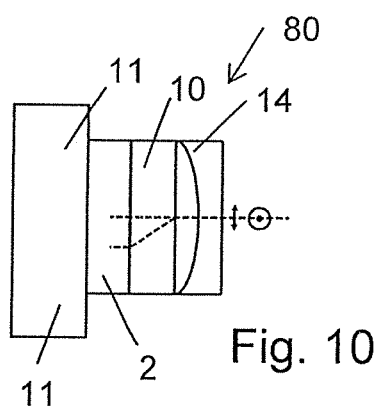
FIGS. 10-14 radiation sources with a monolithic resonator structure.
Figure 11:
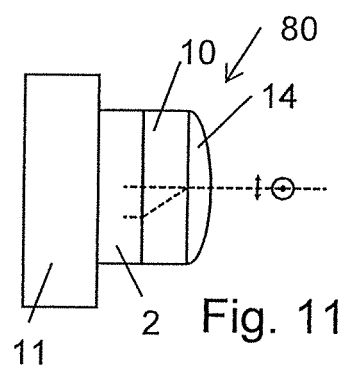
Figure 12:
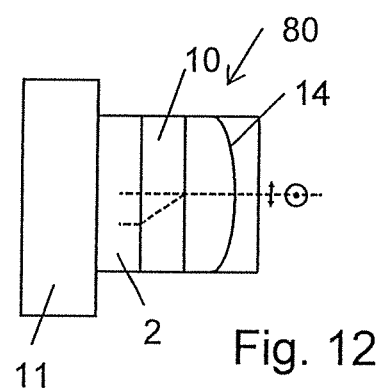
Figure 13:
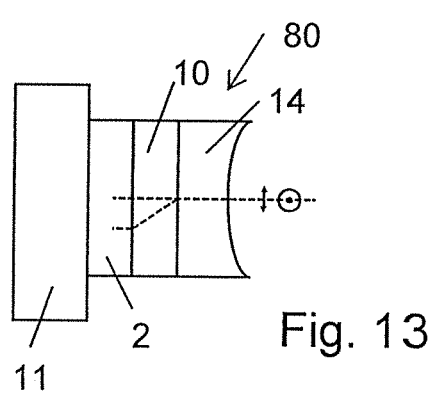
Figure 14:
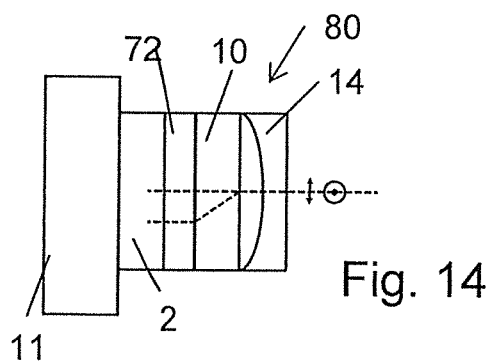

FIGS. 8 and 9 yet show examples of radiation sources in which the gain element and the birefringent element 10 are integrated in a common, monolithic structure.

The common monolithic structure 70 of the radiation source of FIG. 8 includes a flat end mirror 72 that carries the gain element 3—for example a laser crystal—, an intermediate layer 71 and the birefringent element 10. The intermediate layer in this (and in subsequently described embodiments) may, for example, be a bonding layer or a heat spreader, such as a diamond heat spreader.

The birefringent material could at the same time be an electro-optic modulator for repetition rate frequency tuning and stabilization.

The embodiment of FIG. 8 has comprises an external output coupler 14 that defines one end reflector of the laser resonator (the other end reflector being defined by the end mirror 72).

In this external cavity set-up the mode locker, constituted by a saturable absorber, may for example be applied as a layer (not shown in FIG. 8) applied to the flat end mirror 72 or integrated in the flat end mirror. Alternatively, it could also be placed somewhere else in the resonator, in the form of a saturable absorber or a Kerr lens.

The embodiment of FIG. 9 is distinct from the one of FIG. 8 in that the gain element is integrated in a monolithic gain structure 2 that integrates both, a semiconductor gain element and a saturable absorber (MIXSEL structure or MIXSEL 'chip'), for example of the kind illustrated referring to FIG. 2. The monolithic gain structure 2 is mounted on a heat spreader 11. Also in this embodiment, the birefringent element 10 is part of a common monolithic structure 70, which also includes the monolithic gain structure 2. Also in this embodiment, the birefringent element may further serve as electro-optic modulator.

Embodiments of yet a further level of integration are depicted in FIGS. 10-14. In these embodiments, also the output coupler 14 forms part of the monolithic resonator structure 80 that includes the gain element—in the depicted embodiment, the gain element is a semiconductor gain element belonging to a MIXSEL monolithic gain structure 2 of the kind described and discussed hereinbefore.

Thus, the embodiments of FIGS. 10-14 are examples of monolithic resonator (monolithic cavity) radiation sources.

The radiation sources of FIGS. 10-14 are mainly distinct from each other by the nature of the output coupler 14, which is constituted by the respective top reflector that couples out a portion of the intracavity radiation. For this, different geometries are possible, with air or material spacing, with concave or convex shape for mode control, also depending on thermal lens effects arising in the monolithic cavity. The embodiment of FIG. 14 also adds an intermediate layer 71 (that may be a bonding layer or a further heat spreader, in addition to the heat spreader 11 on which the resonator is mounted).

The following may apply:
An intermediate layer may be added to the embodiments of FIGS. 10-13 and further variants also;
The principle, that the birefringent material may optionally also be an electro-optic modulator applies to all embodiments of the present invention;

A monolithic cavity design is possible also for other gain elements than semiconductor gain elements, for example for laser crystals.

What is claimed is:

1. An apparatus for emitting pulsed electromagnetic laser radiation, comprising:
   a laser gain element;
   an optical arrangement defining a laser resonator and arranged to re-direct radiation emitted by the gain element along a beam path back onto the gain element, the optical arrangement comprising an output coupler configured to couple a portion of the radiation in the laser resonator out of the laser resonator;
   a pump arrangement configured to pump the laser gain element;
   wherein the optical arrangement comprises a mode locker placed in the laser resonator in the beam path; and
   wherein the optical arrangement further comprises a birefringent element placed in the laser resonator in the beam path, the birefringent element causing first and second portions of the radiation of different polarization states to be spatially separated, whereby the first and second radiation portions form a first and second modelocked laser beam, the first and second laser modelocked beams sharing the laser gain element.

2. The apparatus according to claim 1, wherein the mode locker is a passive mode locker.

3. The apparatus according to claim 2, wherein the mode locker comprises a saturable absorber.

4. The apparatus according to claim 3, wherein the saturable absorber is integrated in a layered semiconductor structure that acts as a reflector for the intracavity radiation.

5. The apparatus according to claim 3, wherein the first portion and the second portion are incident on spatially separated spots on the saturable absorber.

6. The apparatus according to claim 1, wherein an optical beam path length of the first portion is different from an optical beam path length of the second portion.

7. The apparatus according to claim 1, further comprising a transparent element having an index of refraction different from an index of refraction of a surrounding medium, the transparent element being placed in a beam path of at least one of the portions thereby increasing or reducing an optical path length of one of the portions by a different amount than an optical path length of an other one of the portions.

8. The apparatus according to claim 1, wherein the optical arrangement comprises two end reflectors, whereby the laser resonator supports standing waves.

9. The apparatus according to claim 8, wherein one of the end reflectors is constituted by the output coupler.

10. The apparatus according to claim 1, wherein the pump arrangement comprises an optical pump configured to generate a pumping radiation and to direct the pumping radiation onto the gain element.

11. The apparatus according to claim 10, wherein the gain element is a laser gain crystal.

12. The apparatus according to claim 11, wherein the laser gain crystal is a uniaxial crystal.

13. The apparatus according to claim 10, wherein the gain element is a semiconductor gain element with a layered semiconductor structure, and wherein the semiconductor gain element is emitting in an out-of-plane direction.

14. The apparatus according to claim 13, comprising a monolithic semiconductor gain structure that includes the semiconductor gain element and further includes a saturable absorber as the mode locker.

15. The apparatus according to claim 14, wherein the monolithic semiconductor gain structure acts as a reflector for the intracavity radiation.

16. The apparatus according to claim 15, wherein the monolithic semiconductor gain structure acts as an end reflector.

17. The apparatus according to claim 1, wherein the first portion and the second portion are incident on spatially separated spots on the gain element.

18. The apparatus according to claim 1, wherein the gain element is a semiconductor gain element, and the pump arrangement comprises an electrical pump configured to inject charge carriers into the gain element.

19. The apparatus according to claim 1, further comprising a polarizing beam splitter arranged in a beam path of the radiation portion coupled out of the laser resonator.

20. The apparatus according to claim 1, wherein the birefringent element belongs to a common monolithic structure, the common monolithic structure further comprising the gain element.

21. The apparatus according to claim 20, wherein the optical arrangement defining the laser resonator is constituted by a monolithic resonator structure, in which the gain element and the birefringent element are integrated.

22. A laser radiation source of pulsed electromagnetic laser radiation, comprising:
   a laser gain element;
   a laser resonator;
   the laser resonator being defined by an optical arrangement arranged to re-direct radiation emitted by the gain element along a beam path back onto the gain element, the optical arrangement comprising an output coupler configured to couple a portion of the radiation in the laser resonator out of the laser resonator;
   a pump arrangement configured to pump the laser gain element;
   wherein the optical arrangement comprises a passive mode locker placed in the laser resonator in the beam path;
   wherein the laser resonator is configured for a sufficient number modes, phase locked by the passive mode locker, to coexist for a radiation pulse to travel back and forth in the laser resonator;
   wherein the optical arrangement further comprises a birefringent element placed in the laser resonator in the beam path, the birefringent element causing first and second portions of the radiation of different polarization states to be spatially separated, whereby the first and second radiation portions form a first and second modelocked laser beam sharing the laser gain element, the first and second modelocked laser beams having different laser pulse repetition rates.

23. A dual-comb spectroscopy arrangement, the arrangement comprising
   a laser radiation source of pulsed electromagnetic laser radiation, the laser radiation source comprising:
   a laser gain element;
   a laser resonator;
   the laser resonator being defined by an optical arrangement arranged to re-direct radiation emitted by the gain element along a beam path back onto the gain element, the optical arrangement comprising an output coupler configured to couple a portion of the radiation in the laser resonator out of the laser resonator;
   a pump arrangement configured to pump the laser gain element;

wherein the optical arrangement comprises a passive mode locker placed in the laser resonator in the beam path;

wherein the optical arrangement further comprises a birefringent element placed in the laser resonator in the beam path, the birefringent element causing first and second portions of the radiation of different polarization states to be spatially separated, whereby the first and second radiation portions form a first and second modelocked laser beam, the first and second laser pulsed beams sharing the laser gain element;

the apparatus further comprising a dual-comb spectrometer arranged for the first and second pulsed laser beams to serve as input radiation, each of the first and second laser pulsed beams forming a frequency comb, the frequency combs formed by the first and second pulsed laser beams having slightly offset frequencies.

24. The arrangement according to claim 23, wherein the first and second laser pulsed beams each have a different pulse repetition rate.

\* \* \* \* \*